United States Patent
Matsuo et al.

(10) Patent No.: US 6,573,738 B1
(45) Date of Patent: Jun. 3, 2003

(54) MULTI-LAYERED PROBE FOR A PROBECARD

(75) Inventors: Toshihiro Matsuo, Tokyo (JP); Shigezo Kudo, Tokyo (JP)

(73) Assignee: Tokyo Cathode Laboratory Co., Ltd., Tokyo (JP)

( * ) Notice: Subject to any disclaimer, the term of this patent is extended or adjusted under 35 U.S.C. 154(b) by 0 days.

(21) Appl. No.: 09/535,136

(22) Filed: Mar. 24, 2000

(30) Foreign Application Priority Data

Mar. 25, 1999 (JP) .......................................... 11-081881
Feb. 18, 2000 (JP) ........................................ 2000-042028

(51) Int. Cl.7 .............................................. G01R 31/02
(52) U.S. Cl. ........................................ 324/754; 324/761
(58) Field of Search ........................... 324/754, 761, 324/762, 765; 439/482; 29/832, 882

(56) References Cited

U.S. PATENT DOCUMENTS

| | | | | |
|---|---|---|---|---|
| 4,506,215 A | * | 3/1985 | Coughlin | .................... 324/72.5 |
| 5,330,088 A | * | 7/1994 | Whitlow et al. | ............ 200/268 |
| 5,764,072 A | * | 6/1998 | Kister | ........................ 324/754 |

FOREIGN PATENT DOCUMENTS

| | | |
|---|---|---|
| JP | 60-125741 | 8/1985 |
| JP | 60-299756 | 12/1985 |
| JP | 3180769 | 8/1991 |
| JP | 4354144 | 12/1992 |
| JP | 6281670 | 10/1994 |
| JP | 6300783 | 10/1994 |
| JP | 6313774 | 11/1994 |
| JP | 8311587 | 11/1996 |
| JP | 9119945 | 5/1997 |
| JP | 10221366 | 8/1998 |
| JP | 10-319039 | 12/1998 |
| JP | 10319039 | 12/1998 |
| JP | 10332740 | 12/1998 |
| JP | 11160355 | 6/1999 |
| JP | 2000021528 | 1/2000 |

\* cited by examiner

Primary Examiner—Vinh P. Nguyen
(74) Attorney, Agent, or Firm—Samuels, Gauthier & Stevens, LLP

(57) ABSTRACT

A probe (20) for a probe card that has a multi-layered structure, in which a probe shaft (22) is enclosed by a covering layer (24). The probe shaft (22) is made of conductive metal, and provided with a contact portion (22a) at a tip end for pressing onto a test body to measure electric connection of the test body. The contact portion (22a) is formed having a constant diameter, and retains the constant diameter even after being machined for reuse. The covering layer (24) is made of a material having a high Young's modulus to help counter stresses repeatedly applied to the probe shaft (22), and formed covering the entire external circumferential surface of the probe shaft (22) except for the contact portion (22a). The tip end of the covering layer (24) is tapered in order to deal with a test body with narrower pitches.

6 Claims, 4 Drawing Sheets

MULTI-LAYERED PROBE FOR A PROBECARD

BACKGROUND OF THE INVENTION

1. Field of the Invention

The present invention relates to improvement of a probe for use with a probe card for testing internal connection of an IC wafer.

2. Description of the Related Art

Probe cards are used to test internal connection, characteristics, or performance of IC wafers and so on. A typical probe card is provided with a probe corresponding to an electrode pad formed on each chip on an IC wafer. By pressing the probe onto the electrode pad, tests of electric connection of the pad, such as an open test and a short test, can be performed.

Meanwhile, as memory devices have come to have larger capacities within smaller packages, the interval of electrode pads formed on an IC wafer has grown smaller, and now is commonly about 40 μm. Accordingly, electrode pads have also grown smaller.

To cope with this reduction of intervals between electrode pads, an interval between probes of a probe card for testing connection of an electrode pad must also be reduced. In other words, the diameter of a probe must be made smaller. FIGS. 6 and 7 show a shape of a probe of a conventional probe card, which has been devised to meet such a demand for a smaller interval.

As shown in these drawings, a probe 10 for a probe card is formed having a constant diameter, perhaps 150 μm, so as to be resistive to the pressure with which the probe 10 is pressed onto an electrode pad 11. The tip end 14 of the probe, or a part to be brought into contact with a test object, is formed tapered, or having a taper 12, corresponding to the thickness of the probe. A plurality of such probes 10 are attached to a probe card, and used in a test on electric connection of a plurality of electrode pads formed on a chip.

It is desirable that a probe, which is brought into a contact with a test body to test electrical connections based on conductivity be manufactured of a highly conductive, low contact resistive, and less deformable material due to repeatedly applied stresses. When a probe is pressed directly onto a test body to apply a force thereto, metal flakes may be caused due to friction sliding. Metal flakes are quite harmful and impede accurate measurement.

Meanwhile, a probe made of a material much superior in low contact resistance and high conductivity may generally be weak in strength and thus exhibit inferior restoration to its original shape against repeated stresses when being pressed onto a test body. To meet the above four conditions of high conductivity, low contact resistance, anti-abrasion, and relatively high strength, materials such as rhodium, iridium, and so on are used for probes, even though they are expensive.

A probe is repeatedly used more than hundred thousand times or even million times in an operation to test characteristics of test bodies, and specifically moved, while being in pressured contact with a test body, between the probe and a test body in a test. Therefore, a probe must restore to its original shape after every test operation, even when severe stress is applied to the probe. In this view, a highly elastic material is used for a probe, though such material generally has high contact resistance. Therefore, a larger stress is constantly applied to a conventional probe whereby a certain level of constant contact resistance is retained. This, however, may likely cause deformation or destruction of a probe in an attempt to reduce reducing the probe diameter in order to cope with the need for a smaller pitch.

In addition, as a probe is made of a material harder than that of the object, such as an electrode pad, to be contacted by the probe, metal flakes may be caused during repetitive test operations. Metal flakes may adhere to the contact surface of a probe, and change a contact resistance value. In order to avoid this problem, the tip end of the probe may be machined or ground, upon necessity.

However, as the tip end of a probe is formed tapered, the diameter of the tip end becomes gradually larger as the tip end is being ground. When the diameter is thus changed, the pressure with which and a contact area via which a contact portion of the probe is pressed onto a test body in a test is also changed accordingly. This hinders testing under stable conditions.

Note that Japanese Patent Application Laid-open No. Hei 10-319037 (laid-open date Dec. 4, 1998) is incorporated herein by reference as related art of the present invention.

SUMMARY OF THE INVENTION

The present invention has been conceived to overcome the above problems and aims to provide a probe for use with a probe card with improved resistance to repeatedly applied stresses, allowing testing under stable condition over a long term.

According to the present invention, a covering layer is made of either a first metal which is softened through solution treatment at 1000° C. to 1200° C., and then hardened in aging treatment at 400° C. to 500° C., or a second metal which is softened through annealing and then significantly hardened through working. A probe shaft, supported by the covering layer made of either material described above for reinforcement, is more resistive to stresses repeatedly applied thereto.

Preferably, a probe of a probe card according to the present invention may have a contact portion with a length at least 10 μm, and a constant diameter.

As a contact portion has a predetermined length and a constant diameter, the diameter of a tip end of the contact portion will not be changed, in particular, larger, even when the tip end is machined or ground.

Preferably, the probe shaft of a probe of a probe card according to the present invention may be made any of PALINEY (trademark) (an alloy essentially consisting of Au (10 wt %), Pt (10 wt %), Pd (35 wt %), Ag (30 wt %), Cu, Zn), beryllium copper (Be—Cu), a material from platinum group elements, gold, and gold silicon.

Preferably, the probe shaft of a probe of a probe card according to the present invention may have a multi-layered structure, with each layer being composed of any of PALINEY (an alloy essentially consisting of Au (10 wt %), Pt (10 wt %), Pd (35 wt %), Ag (30 wt %), Cu, Zn), beryllium copper (Be—Cu), a material from platinum group elements, gold, and gold silicon, and to be combined with other layer or layers.

According to the present invention, there is provided a method for manufacturing a probe of a probe card. The probe has a multi-layered structure, including a probe shaft made of conductive metal, of which a contact portion provided at the tip end thereof is brought into contact with a test body to measure electric connection of the test body, and a covering layer including at least one layer formed around an external circumferential surface of the probe shaft. Preferably, the method comprises the steps of: providing a conductive metal bar to be formed into the probe shaft, in a metal cylinder to be formed into a covering layer; softening the conductive bar metal and the metal cylinder in solution treatment or annealing; and stretching the conductive bar metal and the metal cylinder in a softened state, using a coaxial wire drawing method, whereby a probe having a multi-layered structure is formed.

According to the present invention, an inexpensive multi-layered probe of a probe card having high resistance to repeatedly applied stresses and low pressured stable contact resistance, and which does not readily chip metal can be readily manufactured.

BRIEF DESCRIPTION OF THE DRAWINGS

The above and other objects, features, and advantages of the present invention will become further apparent from the following description of preferred embodiments taken in conjunction with the accompanying drawings wherein.

DESCRIPTION OF THE PREFERRED EMBODIMENTS

In the following, preferred embodiments of the present invention will be described with reference to the accompanying drawings.

Embodiment 1.

Figure 1A:
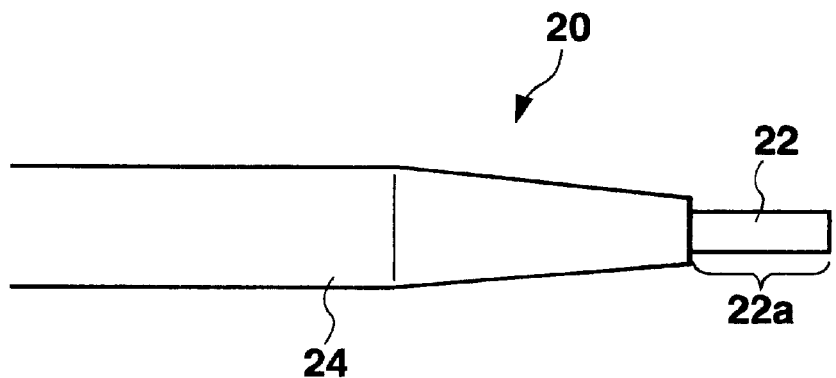
FIG. 1A is a plan view and FIGS. 1B and 1C are sectional views showing a probe of a probe card in a first preferred embodiment.
Figure 1B:
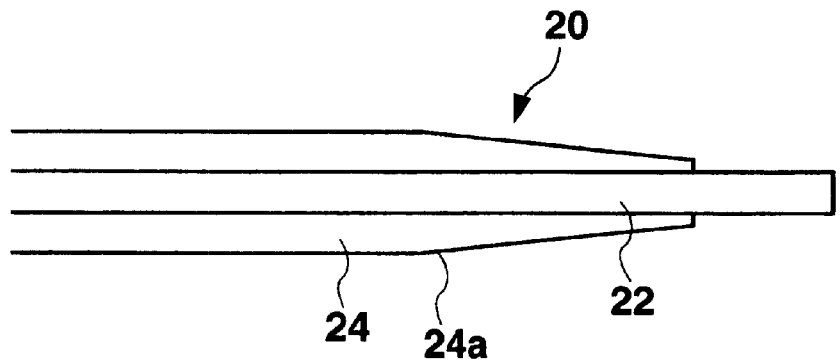
Figure 1C:
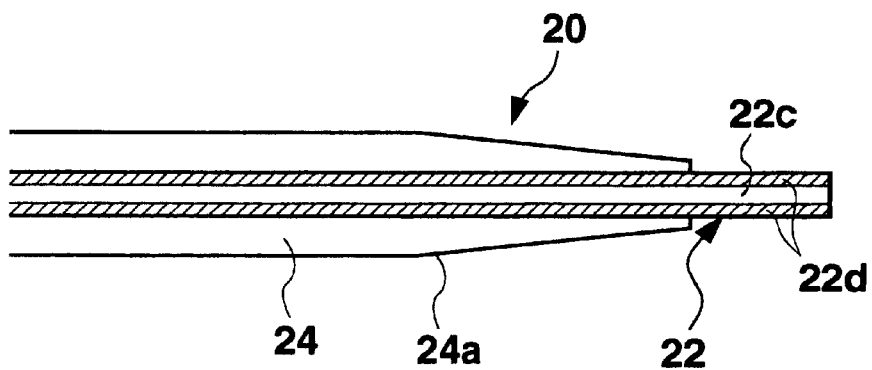
Figure 2:
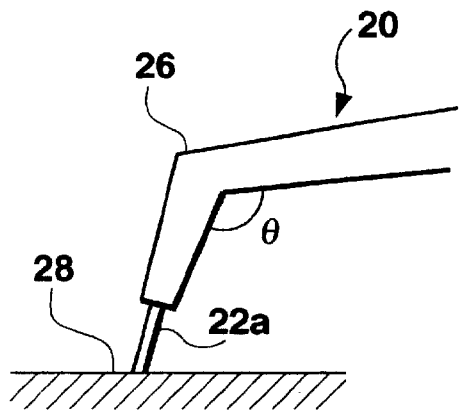
FIG. 2 is a diagram showing a probe of a probe card of the first embodiment in contact with a test body.

FIG. 1A is a plan view and FIGS. 1B and 1C are cross sectional view showing a probe of a probe card according to a first preferred embodiment. FIG. 2 is a diagram showing a probe in contact with a test body.

As shown in FIG. 1B, a probe 20 according to this embodiment has a dual structure comprising a probe shaft 22 and a covering layer 24 which covers the probe shaft 22. The probe shaft 22 is entirely composed of a highly conductive material. At the tip end of the probe shaft 22, a contact portion 22a to be pressed onto a test body to test electric connection thereof, is exposed from the covering layer 24. The highly conductive material to be used for a probe shaft 22, also preferably has a low contact resistance. For such material, PALINEY (an alloy essentially consisting of Au (10 wt %), Pt (10 wt %), Pd (35 wt %), Ag (30 wt %), Cu, Zn, available from J. M Ney Company in the U.S.), beryllium copper (Be—Cu), a material from platinum group elements, gold, gold silicon, and so on are among the available materials. In order to improve anti-abrasion characteristics of the contact portion 22a at the tip end of the probe shaft 22, or a part to be exposed to the outside and brought into contact with a test body, the surface of the above metal attached to the tip end is preferably nitrified so that dusts or wastes will not readily attach.

FIG. 1C shows another structure of a probe 22, in which the probe shaft 22 has a dual structure including a center layer 22 and an outer layer 22d, which covers the center layer 22. The center layer 22c and the outer layer 22d comprise different, but both highly conductive, metals. As such metal, PALINEY (an alloy essentially consisting of Au (10 wt %), Pt (10 wt %), Pd (35 wt %), Ag (30 wt %), Cu, Zn, available from J. M Ney Company in the U.S.), beryllium copper (Be—Cu), a material from platinum group elements, gold, gold silicon, and so on may be employed available. A center layer 22c and an outside layer 22d of a probe 22 may be composed of any combination of metals desirably selected from the above metals.

The diameter of a probe 22 is not limited, and may be desirably determined in relation to the material of a covering layer (described layer) or the size of a test body. For example, the probe shaft 22 may be formed having a diameter equivalent to about ⅓ to ¼ of the entire probe diameter. The probe shaft 22 may be preferably formed such that at least the contact portion 22a thereof has a constant diameter. Preferably, the diameter of the contact portion 22a is determined at an appropriate value in consideration of the pitch of a test body, for example, at 30 μm, more preferably, 20 μm.

Also preferably, the contact portion 22a is brought into a test body 28 in a substantially vertical direction with respect thereto to facilitate pressing the test body 28. For this purpose, the tip end of the probe 20 is bent at a certain angle (θ), as shown in FIG. 2, to constitute a bent portion 26.

The contact portion 22a, provided on the bent tip end side, has a length, unlimited, enough to contact a test body 28 for continuity, i.e., generally 10 μm or longer. Preferably, the length of the contact portion 22a is sufficient to allow for long term use of a probe 20 with occasional grinding of the tip end thereof, specifically, for example, 10 to 100 μm, or even longer if necessary. In addition, the contact portion 22a, which is first formed having a constant diameter, can maintain a constant diameter even when machined or ground and thus becoming shorter, differing from a conventional contact portion, the diameter of which varies. This enables reliable contact between the contact portion 22a and a test body 28, helping to stabilize testing conditions for the test body 28.

The covering layer 24, covering the probe shaft 22, is provided to reinforce, from the outside, interior force for resisting stresses repeatedly applied thereto. For the reinforcement purpose, the covering layer 24 preferably comprises a material superior in elastic characteristics, in particular, having a high Young's modulus. Further, in a case in which the probe shaft 22 is connected via the covering layer 24 to a conductive line and so on formed on a probe card, a covering layer 24 may preferably comprise a highly conductive metal. However, this is not an indispensable condition for the present invention.

Specifically, when conductivity is not required, any resin with a high Young's modulus can be selected from among various resins, to be used for a covering layer 24. On the other hand, when conductivity is required, a conductive metal with a high Young's modulus can be used. Such metals may be those, as first metals, which can be softened through solution treatment and hardened through aging treatment, examples thereof being Elgiloy (an alloy essentially consisting of Co (40 wt %), Ni (15 wt %), Cr (20 wt %), Mo (7 wt %), Mn (2 wt %), and Fe), Hastelloy, inconel, spring SUS, and so on.

Here, solution treatment refers to a process for heating and holding an alloy at a temperature at which one or more components thereof are dissolved into solid solution, and subsequently rapidly cooling the alloy to thereby prevent the components thereof from depositing. A temperature for solution treatment with respect to the first metal may be, for example, 1000° C. to 1200° C. Aging treatment refers to secondary heat processing at a low temperature with respect to an alloy to thereby increase the hardness, strength, and electric conductivity thereof. The process can be applied at, for example, 400° C. to 500° C.

In addition, as second metals, those metals such as rhenium tungsten, which can be softened through annealing at 500° C. to 600° C. and hardened through working, including molding using a dice and so on, can be employed.

Figure 3:
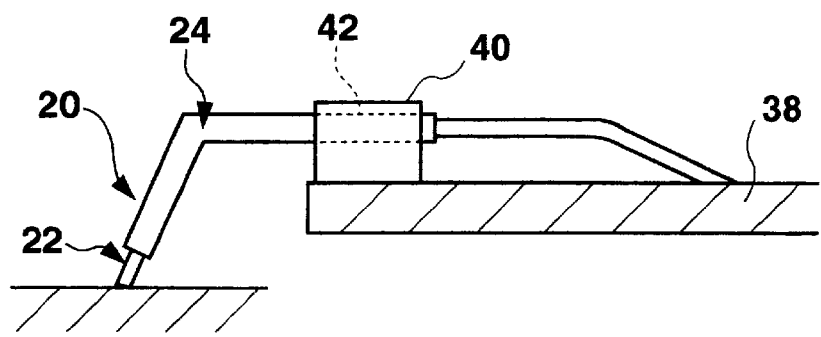
FIG. 3 is a diagram showing an example of a structure of a covering layer of a probe in the first preferred embodiment.
Figure 4:
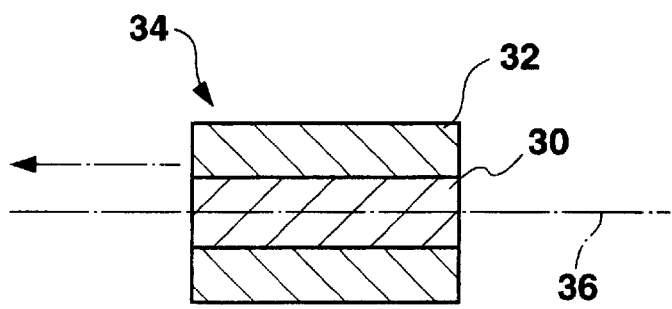
FIG. 4 is a diagram showing an example of a method for manufacturing a probe in the first preferred embodiment.

A covering layer 24 is formed covering the probe shaft 22 so as to reinforce a resistive force against repeatedly applied stresses, and therefore may be formed only on a part of the probe shaft 22, such as a part around the bent portion 26 shown in FIG. 2, which is easily bent due to a pressure with which the probe 20 is pressed onto a test body to test connection thereof. In the case of a covering layer 24 partially formed on the probe shaft 22, the structure shown in FIG. 3 can be employed. Specifically, in FIG. 3, a covering layer 14 is provided to the probe shaft 22 only on a part from a support position 42 toward the tip end of the probe 20, the support position 42 being a position where the probe 20 is supported on the substrate 38 using an insulating material, such as epoxy resin.

For facilitating manufacturing, a covering layer 24 may preferably be formed fully covering the probe shaft 22 except for the contact portion 22a.

Next, a method for manufacturing a probe of a probe card will be described referring to examples shown in FIGS. 1A through 1C, in which a covering layer 24 is provided covering substantially the entire outer circumferential surface of the probe shaft 22.

In this example of a covering layer 24 substantially fully covering the entire outer circumferential surface of the probe shaft 22, a probe having a multi-layered structure according to the present invention can be manufactured using a coaxial wire drawing method. A coaxial wire drawing method is a method in which a metal bar 30 to be formed into a probe shaft 22 is inserted into a metal cylinder 32 to be formed into a covering layer 24, and both are softened through solution treatment, annealing, and so on before being stretched such that shafts 36 of the metal bar 30 and of the metal cylinder 32 coincide with each other.

When any of the above mentioned first metals, i.e., Elgiloy (an alloy essentially consisting of Co (40 wt %), Ni (15 wt %), Cr (20 wt %), Mo (7 wt %), Mn (2 wt %), and Fe), Hastelloy, inconel, and spring SUS, is used for a metal cylinder 32 to be formed into a covering layer 24 of a probe of a probe card, the metal is softened through solution treatment at 1000° C. to 1200° C., and then stretched in a softened state to make the shafts 36 to coincide with each other. The stretched metal is thereafter subjected to aging treatment at 400° C. to 500° C. to be hardened.

Alternatively, when a second metal such as described above, i.e., rhenium-tungsten alloy, is employed for a metal cylinder 32, the metal is softened through annealing at 500° C. to 600° C. and then stretched to make the shafts 36 to coincide with each other. The stretched metal is then given working, such as molding using a dice and so on, to be hardened.

As described above, a coaxial wire drawing method enables manufacturing of a multi-layered probe with ease, and enables mass production of inexpensive probes.

While a probe 20 can be formed having a structure different from those described above, it is nevertheless preferable to form a taper 24a, as shown in FIGS. 1A through 1C, at the tip end of the covering layer 24 in order to copy with a tendency of smaller electrode pad pitches.

Materials for a probe shaft 22 and a covering layer 24 may be properly combined, based on a result of a fatigue test, i.e., testing to determine a range of repeatedly applied stresses which a material can endure without being damaged, such that a resultant probe 22 can be made further resistive to repeatedly applied stresses. The diameter of a probe shaft 22 and the thickness of a covering layer 24 may also be determined based on fatigue testing.

Operation of a probe 20 having the above structure will be described.

A covering layer 24, comprising a material with a higher Young's modulus, is formed covering the central probe shaft 22, thereby realizing a probe 20. A plurality of thus formed probes 20 may be attached to a probe card so as to correspond to a test body, such as electrode pads formed on a chip. The thus formed probe card is used in a test on connection of an electrode pad. In a test, specifically, the probes of a probe card are arranged opposing to the electrode pads, and the contact portions 22a of the respective probes are pressed onto the electrode pads. With the contact portion 22a pressed onto the electrode pad 28, the probe shaft 22 of the probe 20 is bent due to the pressure, and the bent is supported by the covering layer 24. When the test is completed, the probe 20 is removed from the test body 28, and the probe shaft 22 then restores its original shape due to its own restoration power and such power of the covering layer 24. In particular, the restoration power of a covering layer 24, which comprises a material with a higher Young's modulus, is high, and can thus retain its original shape.

Following a test with respect to one test body, another test body is tested. This process will be repeated, during which a probe shaft 22 is supported by a covering layer 24, so that the probe shaft 22 is prevented from being bent and can easily restore its original shape. Therefore, a probe's power to counter repeatedly applied stresses, the insufficiency of which is one of the problems with conventional devices, can be reinforced, and the shape of a probe 20 can be retained over a longer term.

In a long term use of a probe 20, metal flakes and so on adhered to the contact portion 22a may change contact resistance. In such a case, the contact portion 22a is machined to thereby remove the adhered scraps to reform the probe 20 into a usable state. In particular, a probe 20 according to this embodiment can retain a constant diameter despite being ground and thus becoming shorter as it originally has a constant diameter. Therefore, according to the present invention, grinding of contact portion 22a as required in a long term use of a probe 20 does not cause a change in contact pressure of the probe 20, and stable testing conditions can be maintained.

With a probe 20 according to the present invention, strength for withstanding repeatedly applied stresses is reinforced by the covering layer 24, as described above. Therefore, a portion to be brought into contact with a pad can be made with finer structure than in a conventional probe. As a result, a probe adapted to even smaller pitches can be manufactured.

Embodiment 2.

A second preferred embodiment will be described referring to FIG. 5.

Figure 5:
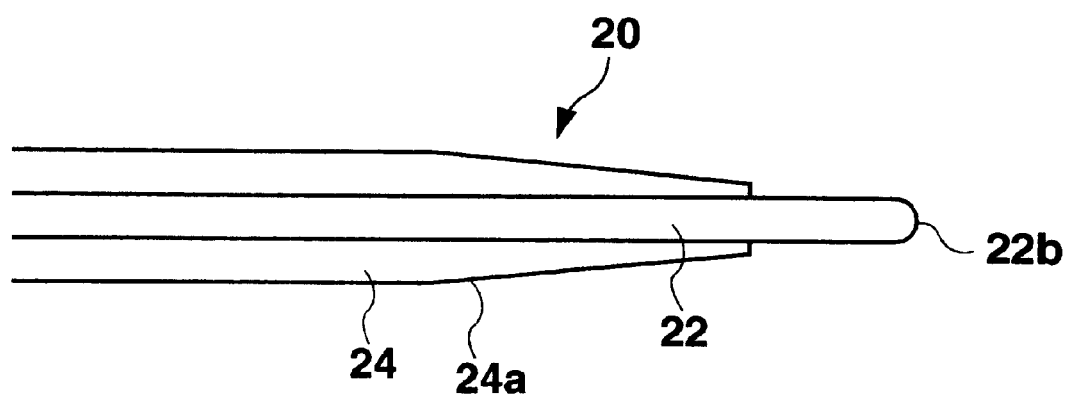
FIG. 5 is a plan view showing a probe of a probe card in a second preferred embodiment.
Figure 6:
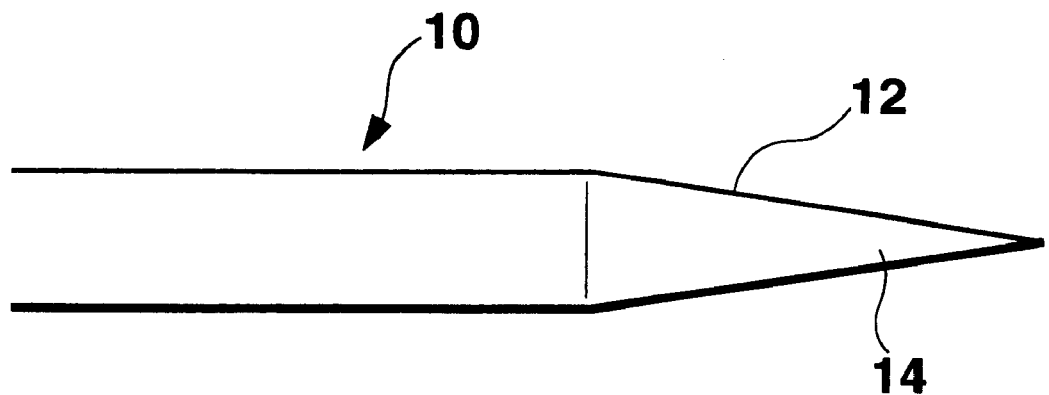
FIG. 6 is a plan view showing a conventional probe.
Figure 7:
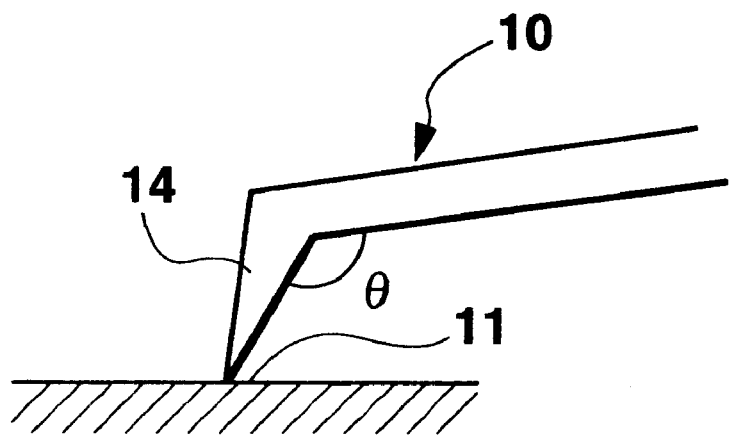
FIG. 7 is a diagram showing a state with a conventional probe of a probe card in contact with a test body.

FIG. 5 is a plan view showing a probe of a probe card according to a second preferred embodiment, in which identical elements to those in the first embodiment are given identical reference numerals, and explanations thereof are not repeated here.

A probe 20 in this embodiment has a probe shaft 22 having a single layer and a rounded tip end 22b. During testing, the tip end 22b of the probe shaft 22 is brought into contact with a test body 28.

When the edge of a planar tip end of a probe shaft 22 is brought into contact with a test body 28, metal flakes and so on may likely be caused. Metal flakes on the contact portion 22a may change electric resistance when the probe 20 is in contact with a test body, destabilizing testing conditions.

In view of the above, in the second embodiment, a probe shaft 22 is formed having a rounded tip end 22b. A rounded tip end effectively reduces the likelihood of metal flakes caused by the probe 20 being brought into contact with a test body, and thereby stabilizes testing conditions. Also, the rounded shape of the tip end 22b ensures that the tip end 22b is in contact with a test body via a constant area despite changes in contact angle. This also helps stabilize testing conditions.

It should be noted that, although the above description of the first and second embodiments focused on a probe having a two-layered structure including a probe shaft and one covering layer, a probe may have a multi-layered structure with two or more covering layers. For example, a probe shaft formed of beryllium copper (Be—Cu), may be covered on the outer circumferential surface thereof by a layer of platinum group elements, constituting a middle layer, and further by a layer of Elgiloy or 30% Re—W alloy, constituting a covering layer. Such a multi-layered probe can further reinforce strength to resist repeatedly applied stresses.

As described above, as a probe shaft according to the present invention is enclosed by material superior in elasticity, in particular, having a high Young's modulus, a probe of a probe card deforms significantly less than a conventional probes when subjected to repeatedly applied stresses. This also allows performance of tests under stable conditions over a long term.

What is claimed is:

1. A probe of a probe card, comprising:

a cylindrical covering layer; and a probe shaft mounted within the cylindrical cover layer and made of a conductive metal, the probe shaft having a contact portion provided at the tip end thereof to be brought out of the cylindrical covering layer into contact with a test body to measure electric connection of the test body, wherein said cylindrical covering layer comprises an Elgiloy, which is softened through solution treatment at 1000° C. to 1200° C., and then hardened in an aging treatment at 400° C. to 500° C.

2. A probe of a probe card according to claim 1, wherein the probe shaft is made of any PALINEY (an alloy essentially consisting of Au (10 wt %), Pt (10 wt %), Pd (35 wt %), Ag (30 wt %), Cu, Zn), beryllium copper (Be—Cu), a material selected from platinum group elements, gold, and gold silicon.

3. A probe of a probe card according to claim 1, wherein the probe shaft has a multi-layered structure, each layer being made of any PALINEY (an alloy essentially consisting of Au (10 wt %), Pt (10 wt %), Pd (35 wt %), Ag (30 wt %), Cu, Zn), beryllium copper (Be—Cu), a material selected from platinum group elements, gold, and gold silicon, and being subjected to a combination with other layer or layers.

4. A probe of a probe card, comprising:

a cylindrical covering layer; and a probe shaft mounted within the cylindrical cover layer and made of a conductive metal, the probe shaft having a contact portion provided at the tip end thereof to be brought out of the cylindrical covering layer into contact with a test body to measure electric connection of the test body, wherein said cylindrical covering layer comprises a Hastelloy or inconel, which is softened through solution treatment at 1000° C. to 1200° C., and then hardened in an aging treatment at 400° C. to 500° C.

5. A probe of a probe card according to claim 4, wherein the probe shaft is made of any PALINEY (an alloy essentially consisting of Au (10 wt %), Pd (35 wt %), Ag (30 wt %), Cu, Zn), beryllium copper (Be—Cu), a material selected from platinum group elements, gold, and gold silicon.

6. A probe of a probe card according to claim 4, wherein the probe shaft has a multi-layered structure, each layer being made of any PALINEY (an alloy essentially consisting of Au (10 wt %), Pt (10 wt %), Pd (35 wt %), Ag (30 wt %), Cu, Zn), beryllium copper (Be—Cu), a material selected from platinum group elements, gold, and gold silicon, and being subjected to a combination with other layer or layers.

* * * * *